(12) United States Patent
Mertol

(10) Patent No.: US 7,787,252 B2
(45) Date of Patent: Aug. 31, 2010

(54) PREFERENTIALLY COOLED ELECTRONIC DEVICE

(75) Inventor: Atila Mertol, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/327,987

(22) Filed: Dec. 4, 2008

(65) Prior Publication Data

US 2010/0142155 A1    Jun. 10, 2010

(51) Int. Cl.
*H05K 7/20* (2006.01)
*H01L 23/34* (2006.01)

(52) U.S. Cl. .................. 361/719; 361/704; 361/707; 361/714; 257/706; 257/712; 257/713; 257/722; 438/122

(58) Field of Classification Search ............ 361/679.54, 361/704, 707, 709, 714, 718–719; 165/80.2, 165/80.3, 185; 174/16.3, 252; 257/706, 257/712–713, 721–722; 438/121–122
See application file for complete search history.

(56) References Cited

U.S. PATENT DOCUMENTS

| | | | | |
|---|---|---|---|---|
| 5,847,936 | A * | 12/1998 | Forehand et al. | ............ 361/794 |
| 5,866,943 | A * | 2/1999 | Mertol | ....................... 257/712 |
| 6,008,536 | A * | 12/1999 | Mertol | ....................... 257/704 |
| 6,525,942 | B2 * | 2/2003 | Huang et al. | ................. 361/704 |
| 6,657,864 | B1 * | 12/2003 | Dyckman et al. | ........... 361/704 |
| 6,809,416 | B1 * | 10/2004 | Sharma | ..................... 257/706 |
| 6,861,283 | B2 * | 3/2005 | Sharma | ..................... 438/106 |
| 6,954,360 | B2 * | 10/2005 | Nurminen | ................... 361/704 |
| 6,967,403 | B2 * | 11/2005 | Chuang et al. | .............. 257/717 |
| 7,030,487 | B1 * | 4/2006 | Keng | ........................... 257/713 |
| 7,098,080 | B2 * | 8/2006 | Takeuchi | .................... 438/122 |
| 7,109,573 | B2 * | 9/2006 | Nurminen | ................... 257/675 |
| 7,112,883 | B2 * | 9/2006 | Hasunuma | .................. 257/714 |
| 7,123,480 | B1 * | 10/2006 | Andoh | ....................... 361/704 |
| 7,271,479 | B2 * | 9/2007 | Zhao et al. | .................. 257/704 |
| 7,514,768 | B2 * | 4/2009 | Andoh | ........................ 257/668 |
| 7,525,182 | B2 * | 4/2009 | Lin et al. | ..................... 257/675 |
| 2009/0302445 | A1 * | 12/2009 | Pagaila et al. | ............... 257/678 |

\* cited by examiner

*Primary Examiner*—Jayprakash N Gandhi
*Assistant Examiner*—Robert J Hoffberg
(74) *Attorney, Agent, or Firm*—Hamilton, DeSanctis & Cha

(57) ABSTRACT

Various apparatuses and methods for a preferentially cooled electronic device are disclosed herein. For example, some embodiments provide an electronic apparatus including a package substrate and with a semiconductor die electrically and thermally connected to the package substrate by a plurality of connection nodes. At least one thermal trace interconnects at least one subset of the plurality of connection nodes. At least one heat dissipation trace on the package substrate is connected to the at least one subset of the plurality of connection nodes.

20 Claims, 3 Drawing Sheets

PREFERENTIALLY COOLED ELECTRONIC DEVICE

BACKGROUND

Electronic devices such as semiconductor integrated circuits can generate a great deal of internal heat due to inefficiencies including resistance to electrical current. If heat is not dissipated from the electronic devices, they can easily be damaged or destroyed by the heat they generate during normal use. For example, computer systems commonly include fans to increase convective cooling of hot integrated circuits. Networked computer equipment is commonly housed in refrigerated rooms. The problem of cooling electronics is so great that even liquid cooling systems have been experimented with. Electronic devices have become increasingly small and complex, with semiconductor processes shrinking for example from 130 microns, to 65 microns, then to 40 microns, etc. More transistors are packed into a smaller area, using more power and generating more heat in increasingly small packages. The problem of drawing heat out from the inside of integrated circuits so that it can be dissipated externally has therefore become increasingly difficult and important.

The problem is even more complex for electronic devices that do not uniformly generate heat. For example, integrated circuits containing multiple processing cores or other extremely active circuits may be surrounded by relatively cooler circuits. This results in multiple hot spots on the integrated circuit that are more difficult to cool than the overall device. Conventional cooling techniques such as heat sinks require a large amount of space and do not address the problem of drawing heat from the inside of an integrated circuit and out through the package around the integrated circuit to the heat sink.

SUMMARY

Various apparatuses and methods for a preferentially cooled electronic device are disclosed herein. For example, some embodiments provide an electronic apparatus including a package substrate with a semiconductor die electrically and thermally connected to the package substrate by a plurality of connection nodes. In some embodiments of the electronic apparatus, the connection nodes may be solder bumps such as ground bumps. Thermal traces interconnect some of the connection nodes. Heat dissipation traces on the package substrate are connected to interconnected connection nodes.

In other instances of the aforementioned electronic apparatus, the semiconductor die includes one or more hot regions such as processor cores, and the interconnected subsets of connection nodes are adjacent the hot regions. The thermal traces may be formed on the semiconductor die, the package substrate or both, such as on outer metal layers of the semiconductor die and/or package substrate.

In some particular embodiments of the electronic apparatus, vias may connect the heat dissipation traces to ground planes in the package substrate. A heat spreader may be connected to the package substrate, and may particularly be connected to the heat dissipation traces on the package substrate. The package substrate may be connected to a printed circuit board by a number of solder balls, and a heat sink may be connected to the heat spreader.

Other particular embodiments provide a method of producing an electronic device, including connecting a semiconductor die to a package substrate through a plurality of solder bumps and interconnecting at least one group of ground bumps in the plurality of solder bumps with thermal traces. At least one heat dissipation trace on the package substrate is connected to the at least one interconnected group of ground bumps. A heat spreader is connected to the package substrate.

In various cases, the method further includes depositing a thermally conductive material between the at least one heat dissipation trace and the heat spreader. The heat dissipation traces may be connected to a ground plane in the package substrate by at least one via.

Other embodiments provide a preferentially cooled electronic device having a package substrate and a semiconductor die with multiple cores. The semiconductor die is electrically and thermally connected to the package substrate by multiple solder bumps. Groups of ground bumps in the solder bumps are interconnected by thermal traces adjacent each of the multiple cores in the semiconductor die. At least one heat dissipation trace is placed on the package substrate and is connected to each interconnected group of ground bumps. Each heat dissipation traces are connected by at least one via to ground planes in the package substrate. A heat spreader is connected to the package substrate, with the thermal traces on the package substrate being connected to the heat spreader. A heat sink is connected to the heat spreader. The package substrate is connected to a printed circuit board by a number of solder balls.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

Figure 1:
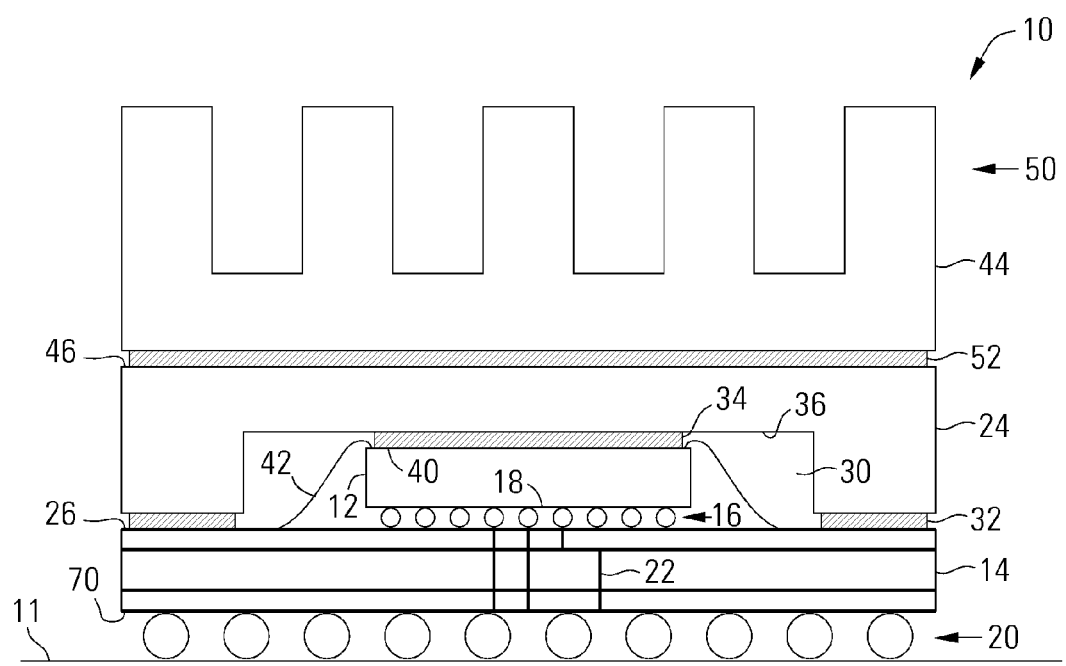
FIG. 1 depicts a cross-sectional side view of a semiconductor die, package substrate, heat spreader and heat sink in accordance with some embodiments of the invention.

The drawings and description, in general, disclose various embodiments of a cooling system for electronic devices. In some particular embodiments, the electronic devices are preferentially cooled to focus the cooling on the hottest regions. In some particular embodiments, the electronic devices are multi-core semiconductor dies assembled in flip chip packages. Before continuing to describe the invention in more detail, a number of terms will be defined to aid in the description.

In various embodiments, the invention may comprise an electronic apparatus. The term electronic apparatus refers to any electronic system having parts to be cooled. For example, the electronic apparatus may be a semiconductor die and a package. The electronic apparatus may be a printed circuit board having an integrated circuit mounted thereon. The electronic apparatus may be full electronic system having a user interface and multiple integrated circuits.

Various embodiments of the electronic apparatus include a package substrate. The package substrate is part or all of a mounting element that houses or supports one or more semiconductor die and that is electrically and thermally connected to the one or more semiconductor die. The term semiconductor die is used herein to refer to a single or to multiple die. The package substrate contains one or more conductive layers arranged for example into power planes, ground planes or signal traces. The package substrate may aid in connecting the one or semiconductor die to a printed circuit board. The package substrate may have any shape and composition. For example, the package substrate may have a flat surface on which the one or more semiconductor die are mounted.

Various embodiments of the electronic apparatus also include a semiconductor die electrically and thermally connected to the package substrate by a plurality of connection nodes. The semiconductor die is an integrated circuit, formed in one or more integral units, and having electrically and thermally conductive connection points for providing power to the semiconductor die and carrying electrical signals. The semiconductor die may contain electrical devices such as transistors, diodes, resistors and capacitors, etc, for processing electrical signals to perform a useful function. The semiconductor die may be formed using any materials such as silicon and containing any type of devices such as complementary metal oxide semiconductor (CMOS) circuits. The connection nodes that connect the semiconductor die to the package substrate may be any type of connection that conducts electricity and heat. In some particular embodiments, the semiconductor die is a flip chip (or controlled collapse chip connection) device having chip pads or connection pads formed on the upper surface to match connection pads formed on the package substrate. In these embodiments, the connection nodes include solder bumps that are formed on the connection pads of the semiconductor die or the package substrate. The semiconductor die is flipped so that the connection pads of the semiconductor die and package substrate are aligned with and facing each other with solder bumps between each pair of connection pads. The solder bumps are then flowed or melted by any suitable technique such as ultrasound, allowing the semiconductor die to collapse against the package substrate with completed electrical and thermal connections between the package substrate and semiconductor die. Again, the electrical apparatus is not limited to this or any other specific type of connection nodes, but may include any type of connection nodes that conduct electricity and heat.

Various embodiments of the electronic apparatus also include at least one thermal trace interconnecting at least one subset of the plurality of connection nodes. The thermal traces are paths provided between connection nodes that increase the transfer of heat between the connection nodes that are interconnected by thermal traces. In some particular embodiments of the electronic apparatus, the subsets of connection nodes that are interconnected by thermal traces are of homogeneous types, such as ground connection nodes. The thermal traces are formed on either or both the package substrate and/or semiconductor die. The thermal traces may be formed in any way that allows heat to flow between the interconnected nodes. In some particular embodiments, the thermal traces are formed in metal layers of the package substrate and/or semiconductor die, such as the outer metal layers in which connection pads are formed. The thermal traces may have any dimensions and topology as limited by the space available on the package substrate and/or semiconductor die, although generally wider thermal traces decrease the amount of thermal resistance and increase thermal dissipation.

Some particular embodiments of the electronic apparatus contain relatively hotter regions that are preferentially cooled. For example, a semiconductor die in the electronic apparatus may contain multiple processor cores that generate relatively more heat than surrounding regions of the semiconductor die. In these embodiments, connection nodes such as ground bumps associated with the hotter regions (e.g., ground bumps for the multiple cores) are interconnected by thermal traces within each hotter region. The thermal traces added for each hotter region preferentially cool the hotter regions as compared with the cooler regions for which thermal traces are not added. The terms hotter and cooler are used herein to indicate relative temperatures. There is no specific limitation on how hot a region must be to be called a hotter region, except that hotter regions generate more heat than cooler regions at some point during operation of the electronic apparatus.

Various embodiments of the electronic apparatus also include at least one heat dissipation trace on the package substrate connected to the interconnected connection nodes. The heat dissipation trace provides a larger heat conductive area to draw heat away from the interconnected connection nodes on the package substrate. In some particular embodiments, the heat dissipation trace extends to an edge of the package substrate where it can be removed from the package in various ways. Some embodiments include one or more vias through the package substrate connecting the heat dissipation trace to one or more ground planes in the package substrate to further dissipate heat. In some particular embodiments, the heat dissipation trace is formed on an outer metal layer of the package substrate on which the semiconductor die is connected. The heat dissipation trace is not limited to any particular dimensions or topology.

Various embodiments of the electronic apparatus also include a heat spreader connected to the package substrate. The heat spreader is formed of a material with a heat conductivity suitable to help dissipate the heat generated by the semiconductor die, such as a metal like copper or a copper alloy. The heat spreader may cover the semiconductor die to provide physical protection. In some particular embodiments, the heat spreader is thermally connected to the heat dissipation traces by a thermally conductive material such as epoxy. If the package substrate is coated with a soldermask layer, the soldermask may be removed or withheld where the heat dissipation traces meet the heat spreader.

Referring now to FIG. 1, a preferentially cooled electronic device 10 will be described in more detail. A semiconductor die 12 is mounted on a package substrate 14 by a number of connection nodes such as solder bumps 16. The package substrate 14 may be mounted to a printed circuit board 11 by a number of solder balls 20 or other connectors. Note that the solder bumps 16 and solder balls 20 are shown in their unflowed state for clarity in the drawing, even though other components of the electronic apparatus 10 that are shown attached are not normally attached until after the solder bumps 16 have been flowed or melted to complete the connections. Solder bumps 16 and solder balls 20 may be formed of any suitable material, such as a fusible metal or metal alloy that melts under the desired temperature and heat source (e.g., ultrasound). For example, the solder bumps 16 and solder balls 20 may be made of a tin alloy, with or without a flux material. The semiconductor die 12 may consist of a single unitary integrated circuit or multiple integrated circuits each individually connected to the package substrate 14 as desired. The semiconductor die 12 illustrated in FIG. 1 is a flip chip package, with connector pads for the solder bumps 16 being formed on the upper surface of the semiconductor die 12 and with the semiconductor die 12 being flipped or inverted. This allows the solder bumps 16 to contact connection pads on the upper surface of the package substrate 14 and on the inverted upper surface 18 of the semiconductor die 12. In other particular embodiments, the semiconductor die 12 may be connected to the package substrate 14 in any other suitable manner. The solder bumps 16 and corresponding connection pads on the semiconductor die 12 and package substrate 14 are placed and numbered as needed to provide power and ground supplies and input/output (I/O) signals to the semiconductor die 12 through the package substrate 14. The solder bumps 16 are formed of a conductive metal and have a better heat conductivity than the air or other insulative materials that may surround and make up the semiconductor die 12. The semiconductor die 12 generates heat internally during operation due to factors such as electrical resistance within the circuits inside the semiconductor die 12. The solder bumps 16 thus also serve to conduct heat generated inside the semiconductor die 12 out to the package substrate 14.

The package substrate 14 may be formed with any number of conductive layers separated by insulating layers, as will be described in more detail with respect to FIG. 3 below. Vias (e.g., 22) are formed in the package substrate 14 to provide electrical connections between different conductive layers. Vias may be formed in any suitable manner. In one particular embodiment, vias are formed by drilling circular holes through the package substrate 14 perpendicular to the surface, and coating the walls of the resulting shafts or filling the shafts with solder or some other conductive material or metal. Vias may connect internal conductive layers in the package substrate 14 or may extend all the way through the package substrate 14 between outer conductive layers as desired. Note that only a few examples of vias are shown in FIG. 1 to illustrate their configuration in some particular embodiments. For example, other vias (not shown in FIG. 1) may be added to provide additional thermal dissipation as will be described below.

A heat spreader 24 may be connected to the package substrate 14 to aid in heat dissipation and to provide physical protection to the semiconductor die 12 by covering it. The heat spreader 24 may be formed of any material having suitable thermal conductivity characteristics, such as copper or a copper alloy. In one particular embodiment, the heat spreader 24 has a square or rectangular profile to match that of the surface 26 of the package substrate 14 and is coextensive with the surface 26 of the package substrate 14. A cavity 30 is formed in the body of the heat spreader 24 sufficiently large to enclose the semiconductor die 12. The heat spreader 24 may be connected to the package substrate 14 in any suitable fashion. For example, an adhesive 32 such as an epoxy with good thermal conductivity may be used. A thermally conductive adhesive 34 may also be applied between the upper interior surface 36 of the heat spreader 24 and the inverted bottom surface 40 of the semiconductor die 12 to physically connect the semiconductor die 12 to the heat spreader 24 and to improve thermal dissipation from the semiconductor die 12 to the heat spreader 24. If desired, wire bonds 42 may also be included to electrically connect the semiconductor die 12 with the package substrate 14.

In some particular embodiments, the semiconductor die 12 may also be underfilled to provide physical support and adhesion, electrical insulation and thermal conductivity. In these embodiments, any spaces left between the inverted upper surface 18 of the semiconductor die 12 and the upper surface 26 of the package substrate 14 after the solder bumps 16 are flowed may be filled by an electrically insulative material such as an epoxy by injecting it under the semiconductor die 12.

A heat sink 44 may also be connected to the heat spreader 24 to further increase the heat dissipation of the electronic apparatus 10. The heat sink 44 may have any suitable size, shape and material to dissipate heat. For example, a thermally conductive material such as copper or copper alloy may be used. In one example, the heat sink 44 is coextensive with an upper surface 46 of the heat spreader 24 and includes a number of fins 50 to increase the surface area of the heat sink 44, thereby facilitating convective dissipation of heat from the electronic apparatus 10. The heat sink 44 may be attached to the heat spreader 24 by a thermally conductive adhesive 52 such as epoxy, as well as by mechanical fasteners (not shown) as desired. In some embodiments without a heat spreader, the package is molded on or around the semiconductor die to form a molded package or the semiconductor die is directly attached to the substrate without any heat spreader or stiffener.

Figure 2:
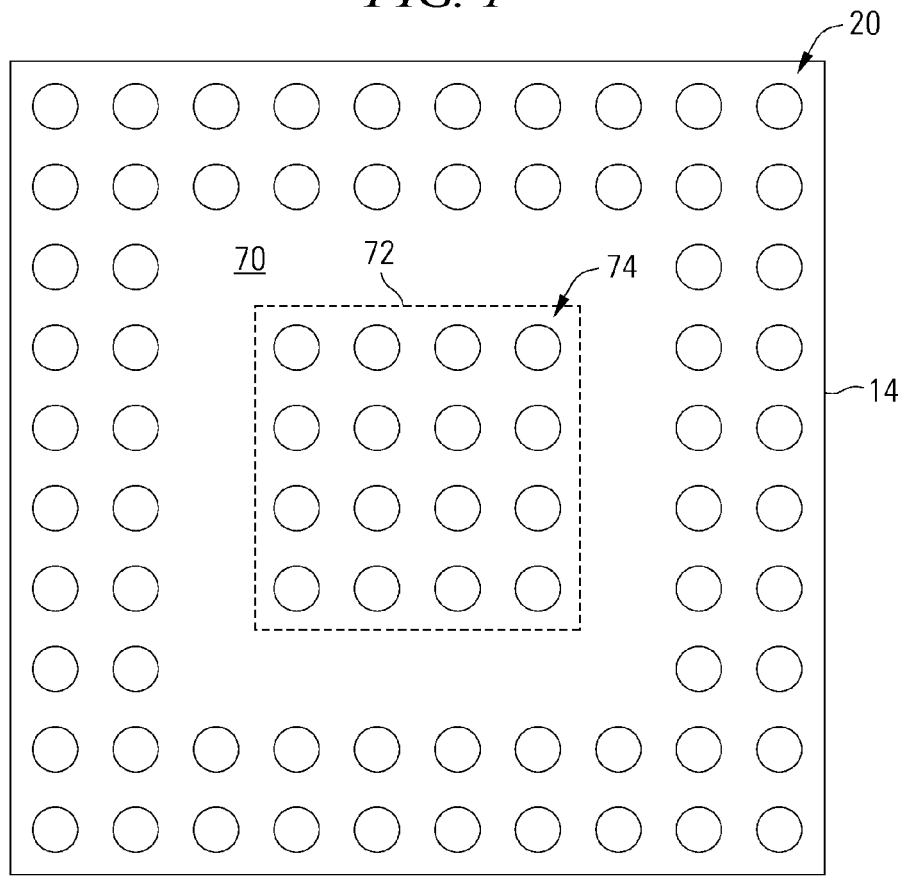
FIG. 2 depicts a bottom view of the package substrate of FIG. 1.

A bottom view of the lower surface 70 of the package substrate 14 is illustrated in FIG. 2, showing the solder balls 20 arranged around the edges of the package substrate 14. Again, the solder balls 20 are placed as needed to carry power, ground and I/O signals to and from the package substrate 14. The outline 72 of the semiconductor die 12 location on the upper surface 26 of the package substrate 14 is also shown. An array of thermal balls 74 are included within the outline 72 of the semiconductor die 12 on the lower surface 70 of the package substrate 14 under the semiconductor die 12 to increase thermal conductivity between the package substrate 14 and a printed circuit board (not shown). The thermal balls 74 may be made of any suitable thermally conductive material, such as the same solder as in the solder balls 20. The thermal balls 74 are added to increase thermal conductivity. In other embodiments, solder balls may be placed to carry electrical signals as well as to dissipate heat within the outline 72 of the semiconductor die 12 on the lower surface 70 of the package substrate 14. Conductive traces may also be included on the lower surface 70 of the package substrate 14, but are omitted from FIG. 2 to simplify the drawing for clarity. In other particular embodiments, the package substrate 14 may have other types of connection nodes on the lower surface 70 or elsewhere on the package substrate 14 to connect the package substrate 14 to a printed circuit board or other electrical connection point. For example, the package substrate 14 may be designed with pins or compression pads, etc for connection in a socket or other type of connector. Furthermore, it is important to note that the shape and size of various components of the electronic apparatus 10 are not limited to that shown in the drawings, but may be adapted as desired based on the requirements of the electronic apparatus 10. The size, number and placement of solder balls 20 and/or thermal balls 74 may also be adapted as desired based on the requirements of the overall electrical system.

Figure 3:
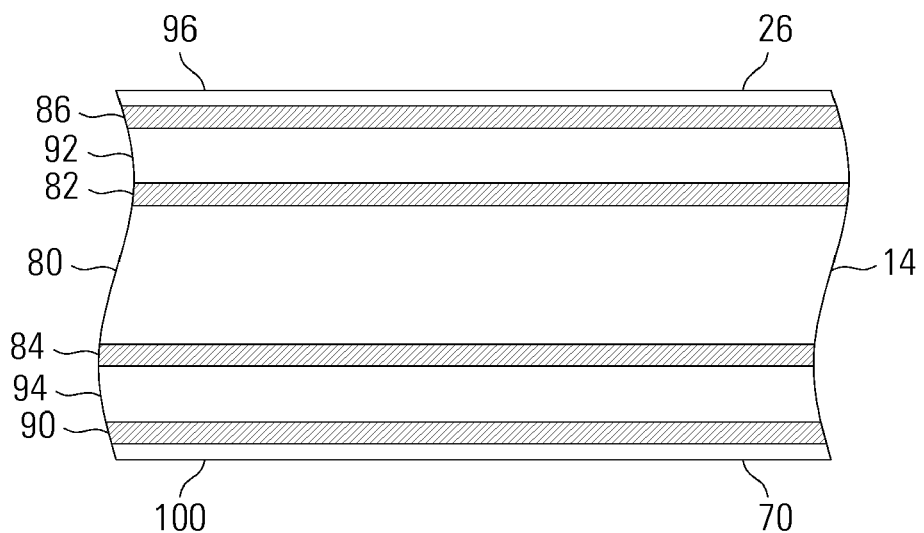
FIG. 3 depicts a cross-sectional side view of the package multi-layer substrate of FIG. 1 in more detail.

Turning now to FIG. 3, a cross-sectional side view of a portion of one example of a package substrate 14 will be described. An insulating core 80 may be used to provide physical stability and structure to the package substrate 14. The core 80 may be made of any suitable insulating material, such as a fibrous cured resin. Power planes 82 and ground planes 84 may be included to provide power to the semiconductor die 12 and to provide shielding of electromagnetic interference (EMI) to and from the semiconductor die 12. Conductive routing layers 86 and 90 may be included to form traces to carry signals between connection pads on the upper and lower surfaces 26 and 70 of the package substrate 14. The routing layers 86 and 90 may be made of any suitable conductive material, such as a metal with high electrical and thermal conductivity. Connection pads and thermal dissipation traces may be formed in the outer metal layers 86 and 90 as needed. Soldermask layers 96 and 100 are provided on the upper and lower surfaces 26 and 70 of the package substrate 14, electrically insulating and protecting the outer metal layers 86 and 90 everywhere except where electrical or thermal connections are to be made, such as over connection pads for solder balls 20, thermal balls 74 and solder bumps 16, and over heat dissipation traces where they contact the heat spreader 24 as will be described in more detail below. The number, type and placement of conductive and insulating layers may be adapted as needed based on the requirements of the electronic apparatus 10. For example, if a great number of I/O signals are used by the semiconductor die 12, a larger number of metal routing layers and surrounding insulating layers may be needed in the package substrate 14. Conductive layers (e.g., 82, 84, 86 and 90) are isolated by insulating layers 80, 92 and 94, such as core and pre-preg layers. Again, the insulating layers may be formed of any suitable material, such as "pre-impregnated" composite fibers or pre-preg. Note that FIG. 3 shows only the layers for clarity, and does not show the structure of traces and vias.

Figure 4:
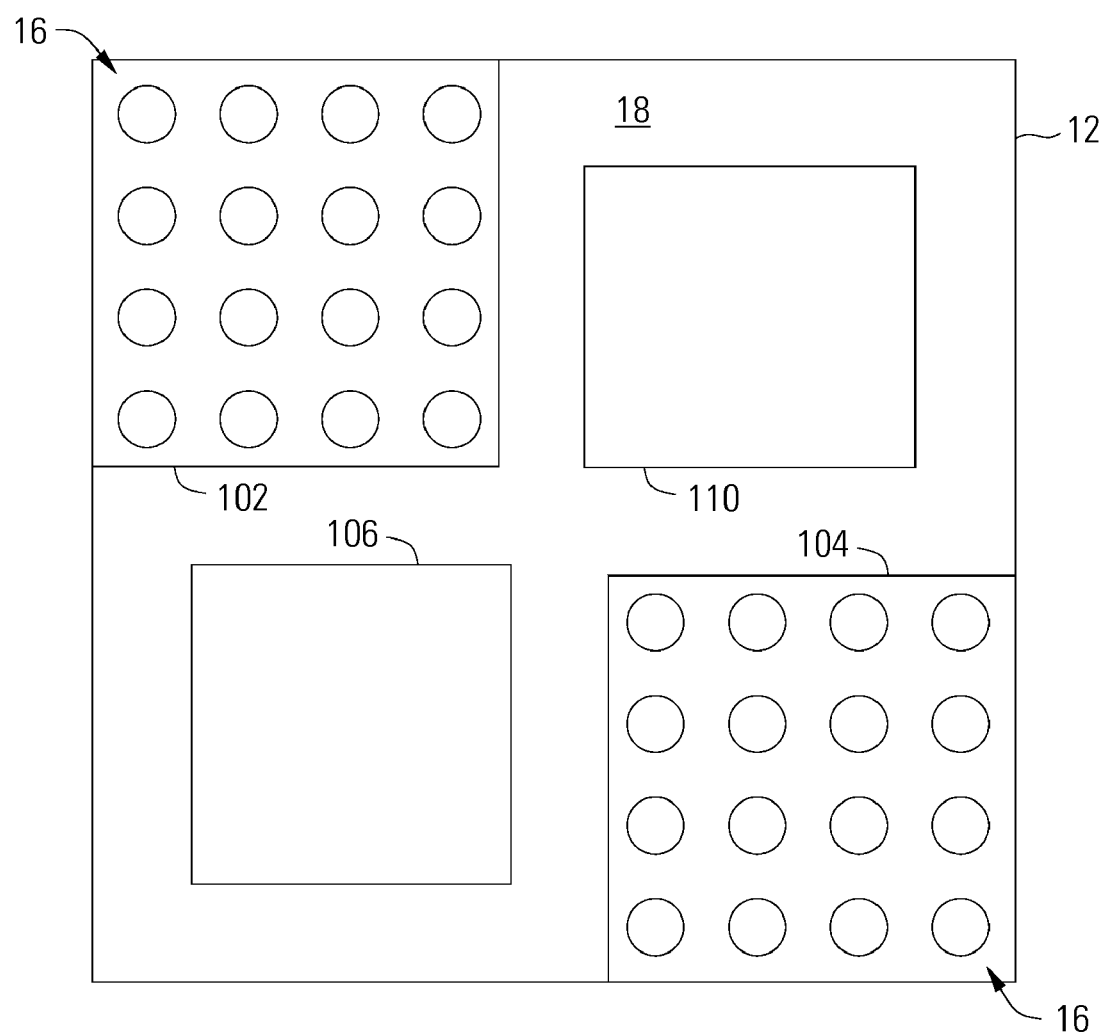
FIG. 4 depicts a bottom view of the semiconductor die of FIG. 1.

Turning now to FIG. 4, a bottom view of the inverted upper surface 18 of the semiconductor die 12 will be described. Various different regions to be preferentially cooled are shown. In this particular embodiment the semiconductor die 12 includes two processor cores, and the core regions 102 and 104 to be preferentially cooled are shown. Regions 106 and 110 corresponding to cooler circuitry in the semiconductor die 12 are also shown. The placement of solder bumps 16 is shown only in the hot regions 102 and 104, although they may be arrayed across the entire inverted upper surface 18 of the semiconductor die 12 as desired. Other features of the inverted upper surface 18 of the semiconductor die 12 are omitted from FIG. 4 for clarity, such as connector pads and traces, including heat dissipation traces if placed on the semiconductor die 12.

Figure 5:
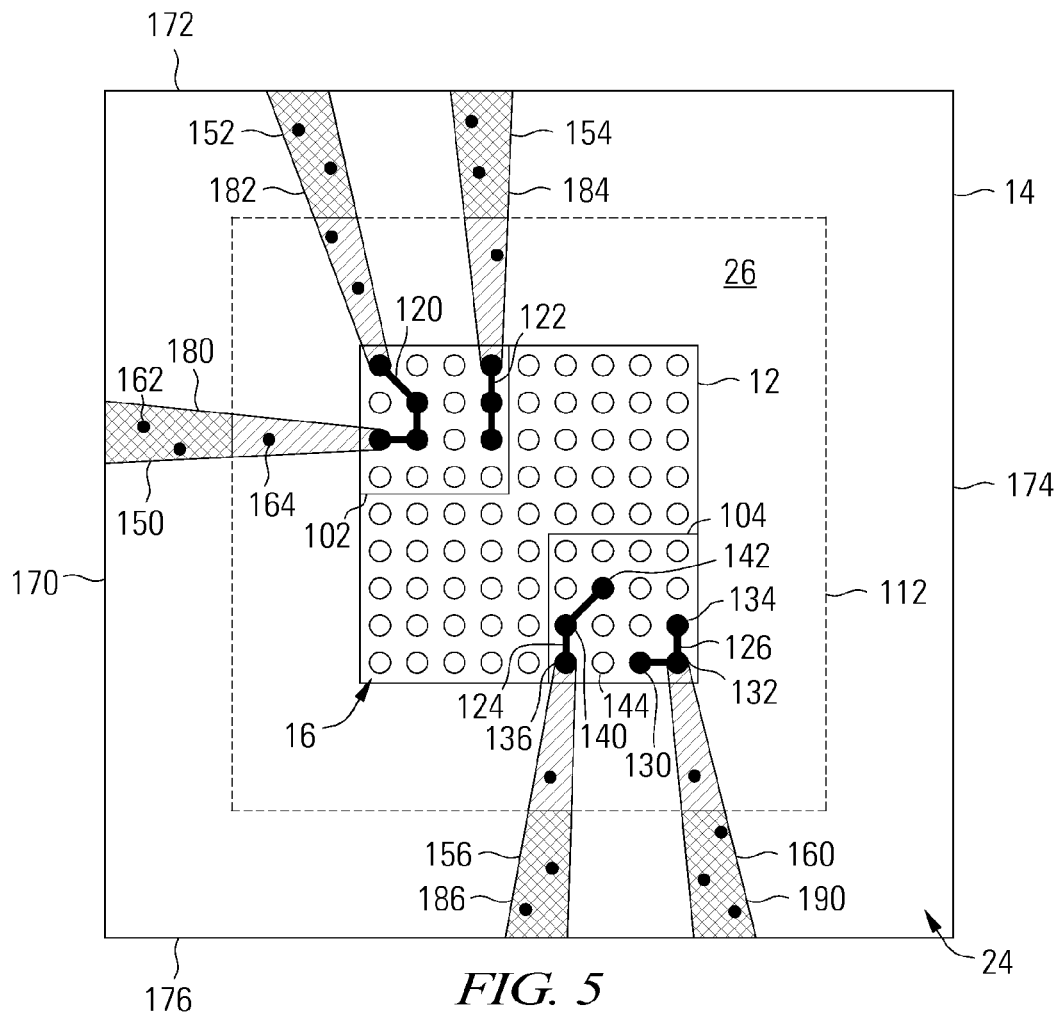
FIG. 5 depicts a top view of the package substrate of FIG. 1.

Turning now to FIG. 5, the upper surface 26 of the 14 is shown with the location for the semiconductor die 12 with its hot regions 102 and 104. The locations of solder bumps 16 are shown within the outline of the semiconductor die 12. As discussed above, the solder bumps 16 may be connected either to the semiconductor die 12 or the package substrate 14 before flowing, but are shown in both views of the semiconductor die 12 and the package substrate 14 to illustrate their placement in one example of the electronic apparatus 10. An outline 112 in FIG. 5 illustrates the placement of the heat spreader 24 around the edges of the package substrate 14. Thermal traces 120, 122, 124 and 126 are used to interconnect groups of connection nodes to improve thermal dissipation. The thermal traces (e.g., 120) are made of a thermally conductive material such as a metal in a routing layer (e.g.,. 86) in the package substrate 14 or semiconductor die 12. The thermal traces (e.g., 120) may be formed on a single layer of the package substrate 14 or semiconductor die 12 or on multiple layers of either or both. In one particular embodiment, the thermal traces (e.g., 120) are formed in the outer metal layer 86 of the package substrate 14, in the same layer that the connection pads are formed for connection to the solder bumps 16. The thermal traces (e.g., 120) may have any size and shape desired and as limited by the available space in the various layers of the package substrate 14 and semiconductor die 12. In one particular embodiment, the thermal traces (120) are made substantially as large as possible on the outer metal layer 86 between connection pads without shorting to neighboring pads or traces. The groups of connection nodes that are interconnected by thermal traces (e.g., 120) are homogeneous nodes in one particular embodiment, such as ground nodes. The thermal traces (e.g., 120) thus provide additional thermal connection between homogeneous connection nodes in a particular region to be preferentially cooled. For example, thermal trace 126 interconnects ground bumps 130, 132 and 134 in hot region 104. Another thermal trace 124 interconnects ground bumps 136, 140 and 142 in the same hot region 104 because non-ground bumps (e.g., 144), are interposed between the first group or subset of ground bumps 130, 132 and 134 and the second group of ground bumps 136, 140 and 142. In other embodiments, all ground bumps 130, 132, 134, 136, 140 and 142 may be interconnected with a single thermal trace by careful routing on one or more conductive layers of the semiconductor die 12 and/or package substrate 14. Note that interconnecting ground bumps by thermal traces is equivalent to interconnecting connection pads by thermal traces, with ground bumps then placed and flowed on the connection pads.

Thermal dissipation traces 150, 152, 154, 156 and 160 are placed on the package substrate 14, with at least one thermal dissipation trace connected to each interconnected group of connection nodes. The thermal dissipation traces (e.g., 150) may be connected to a connection pad under a solder bump, or to a thermal trace connected to a connection pad, or in any other way to provide a thermal connection to the interconnected group of connection nodes. The thermal dissipation traces 150, 152, 154, 156 and 160 may be formed on any conductive layer of the package substrate 14 desired. In one particular embodiment, the thermal dissipation traces 150, 152, 154, 156 and 160 are formed in the outer metal layer 86 of the upper surface 26 of the semiconductor die 12, on the same layer as the connection pads formed for the solder bumps 16. The thermal dissipation traces 150, 152, 154, 156 and 160 may have any size, shape and placement desired, although the larger the thermal dissipation traces 150, 152, 154, 156 and 160, the greater the heat dissipation generally. Vias (e.g., 162 and 164) may be formed in the package substrate 14 between each thermal dissipation trace (e.g., 150) and other planes or traces in the package substrate 14. For example, in one particular embodiment in which ground bumps are interconnected by thermal traces and the thermal dissipation traces (e.g., 150) are connected to these interconnected ground bumps, the vias (e.g., 162 and 164) connect the thermal dissipation traces (e.g., 150) to a ground plane 84 in the package substrate 14. This increases the heat dissipation from the thermal dissipation traces (e.g., 150) and improves the electrical connection between the ground plane 84 and the ground bumps.

The thermal dissipation traces 150, 152, 154, 156 and 160 in some embodiments extend to the edges 170, 172, 174 and 176 of the upper surface 26 of the package substrate 14. Regions 180, 182, 184, 186 and 190 where the heat spreader 24 overlaps the thermal dissipation traces 150, 152, 154, 156 and 160 (illustrated with crosshatching in FIG. 5) conduct heat from the thermal dissipation traces 150, 152, 154, 156 and 160 to the heat spreader 24. In these regions 180-190, the soldermask 96 is removed or withheld so that the thermal dissipation traces 150, 152, 154, 156 and 160 can directly contact the heat spreader 24. The thermally conductive epoxy or other material used to connect the heat spreader 24 to the package substrate 14 thus forms a highly thermally conductive connection between the thermal dissipation traces 150, 152, 154, 156 and 160 and the heat spreader 24. Heat from the semiconductor die 12 is thus transferred from the semiconductor die 12, through the interconnected connection nodes (e.g., 130) and the thermal dissipation traces 150, 152, 154, 156 and 160 to ground planes in the package substrate 14 and out to the circuit board or other mounting surface or connector, as well as to the heat spreader 24 and optional heat sink 44.

Figure 6:
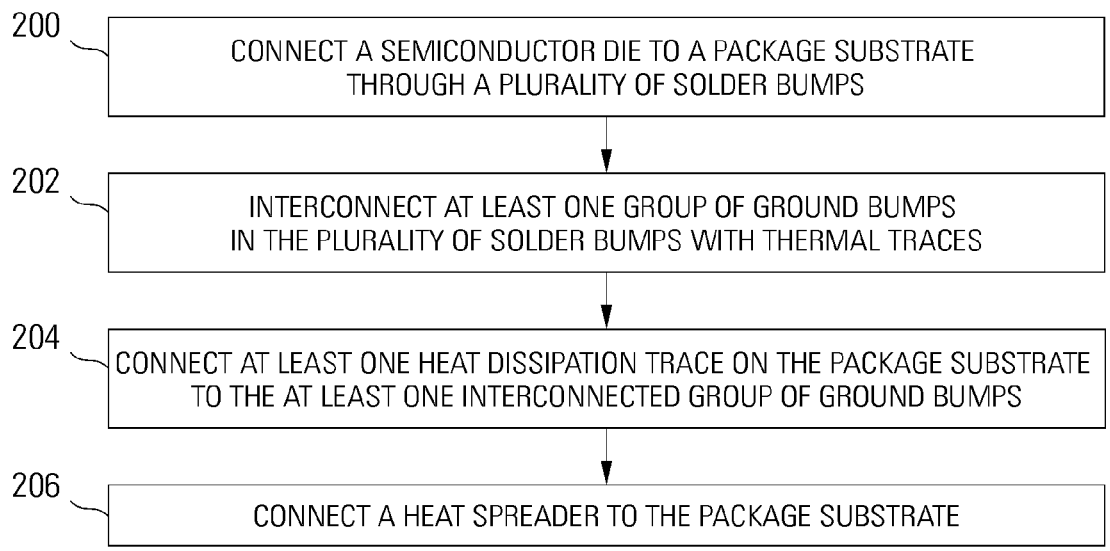
FIG. 6 is a flow chart of a method for producing a preferentially cooled electronic device in accordance with some embodiments of the invention.

A method of producing an electronic device is summarized in the flow chart of FIG. 6. A semiconductor die is connected to a package substrate through a plurality of solder bumps. (Block 200) At least one group of ground bumps in the plurality of solder bumps is interconnected with thermal traces. (Block 202) At least one heat dissipation trace on the package substrate is connected to the at least one interconnected group of ground bumps. (Block 204) A heat spreader is connected to the package substrate. (Block 206) In various embodiments, a thermally conductive material is deposited between the at least one heat dissipation trace and the heat spreader. In some embodiments, at least one heat dissipation trace is connected to a ground plane in the package substrate by at least one via.

The preferentially cooled electronic device disclosed herein provides substantial benefits for cooling electronic circuits as they become smaller and more dense and consequently generate more heat. With the augmentation of the heat path, additional heat can be dissipated through the device and package both laterally and vertically, directly from the highest power circuitry. Some devices using the augmented heat paths disclosed herein may no longer require heat sinks or as large of heat sinks. The heat spreader may be directly connected with ground planes by the augmented heat paths, resulting in improved electromagnetic shielding and grounding. The preferentially cooled electronic device is applicable to a wide range of electronic devices and packages, such as the flip chip described herein with a protective heat spreader or with a bare die flip chip package with soldermask coating.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. An electronic apparatus comprising:
    a package substrate;
    a semiconductor die including a plurality of cores;
    at least one thermal trace interconnecting at least one subset of a plurality of connection nodes thermally connecting the semiconductor die to the package substrate; and
    at least one heat dissipation trace on the package substrate connected to the at least one subset of the plurality of connection nodes, wherein less than all of the plurality of cores are connected to any heat dissipation trace on the package substrate.

2. The electronic apparatus of claim 1, wherein the plurality of connection nodes comprise solder bumps.

3. The electronic apparatus of claim 2, wherein the solder bumps comprise ground bumps.

4. The electronic apparatus of claim 1, wherein the semiconductor die comprises at least one hotter region and at least one cooler region, and wherein the at least one subset of the plurality of connection nodes is adjacent the at least one hotter region.

5. The electronic apparatus of claim 1, wherein the at least one thermal trace comprises a trace between the subset of the plurality of connection nodes on at least one metal layer of the package substrate.

6. The electronic apparatus of claim 5, wherein the at least one metal layer comprises an outer metal layer containing a plurality of connection pads for the plurality of connection nodes.

7. The electronic apparatus of claim 5, wherein the package substrate includes at least one inner conductive layer, and wherein the at least one thermal trace comprises a trace connecting to the at least one inner conductive layer.

8. The electronic apparatus of claim 5, wherein the at least one heat dissipation trace extends to the edge of the package substrate.

9. The electronic apparatus of claim 1, wherein the at least one thermal trace comprises a trace between the subset of the plurality of connection nodes on at least one metal layer of the semiconductor die.

10. The electronic apparatus of claim 1, wherein the at least one thermal trace comprises a first trace between the subset of the plurality of connection nodes on a metal layer of the package substrate and a second trace between the subset of the plurality of connection nodes on at least one metal layer of the semiconductor die.

11. The electronic apparatus of claim 1, further comprising at least one via between the at least one heat dissipation trace and a ground plane in the package substrate.

12. The electronic device of claim 1, further comprising a heat spreader connected to the package substrate.

13. The electronic device of claim 12, further comprising a thermally conductive material deposited between the at least one heat dissipation trace and the heat spreader.

14. The electronic device of claim 13, further comprising a soldermask layer on a surface of the package substrate adjacent the semiconductor die, the soldermask layer having at least one gap in a region between the at least one heat dissipation trace and the heat spreader.

15. The electronic device of claim 12, further comprising a printed circuit board connected to the package substrate by a plurality of solder balls.

16. The electronic device of claim 15, further comprising a heat sink connected to the heat spreader.

17. A method of producing an electronic device, the method comprising:
    providing a package substrate including an inner conductive layer;
    connecting a semiconductor die to the package substrate through a plurality of solder bumps;
    interconnecting at least one group of ground bumps in the plurality of solder bumps with thermal traces, and wherein at least one of the thermal traces extends across the inner conductive layer;
    connecting at least one heat dissipation trace on the package substrate to the at least one interconnected group of ground bumps; and
    connecting a heat spreader to the package substrate.

18. The method of claim 17, further comprising depositing a thermally conductive material between the at least one heat dissipation trace and the heat spreader.

19. The method of claim 17, further comprising connecting the at least one heat dissipation trace to a ground plane in the package substrate by at least one via.

20. A preferentially cooled electronic device comprising:
    a package substrate;
    a semiconductor die comprising a plurality of cores, the semiconductor die being thermally connected to the package substrate by a plurality of solder bumps;
    at least one thermal trace interconnecting at least some ground bumps in the plurality of solder bumps adjacent each of the plurality of cores, wherein the thermal trace is non-uniformly distributed to provide preferential cooling to one of the plurality of cores in comparison to another of the plurality of cores;

at least one heat dissipation trace on the package substrate connected to each of the interconnected ground bumps;

a via connecting each said at least one heat dissipation trace to a ground plane in the package substrate;

a heat spreader connected to the package substrate, wherein the at least one thermal trace is connected to the heat spreader;

a heat sink connected to the heat spreader; and a printed circuit board connected to the package substrate by a plurality of solder balls.

* * * * *